(12) United States Patent
Luan

(10) Patent No.: US 11,721,657 B2
(45) Date of Patent: Aug. 8, 2023

(54) WAFER LEVEL CHIP SCALE PACKAGE HAVING VARYING THICKNESSES

(71) Applicant: STMICROELECTRONICS PTE LTD, Singapore (SG)

(72) Inventor: Jing-En Luan, Singapore (SG)

(73) Assignee: STMICROELECTRONICS PTE LTD, Singapore (SG)

(*) Notice: Subject to any disclaimer, the term of this patent is extended or adjusted under 35 U.S.C. 154(b) by 74 days.

(21) Appl. No.: 16/874,392

(22) Filed: May 14, 2020

(65) Prior Publication Data

US 2020/0395324 A1 Dec. 17, 2020

Related U.S. Application Data

(60) Provisional application No. 62/861,923, filed on Jun. 14, 2019.

(51) Int. Cl.
*H01L 23/00* (2006.01)
*H01L 23/498* (2006.01)

(52) U.S. Cl.
CPC ........ *H01L 24/14* (2013.01); *H01L 23/49816* (2013.01)

(58) Field of Classification Search
CPC ..... H01L 24/32; H01L 21/4871; H01L 23/24; H01L 23/3128; H01L 23/13; H01L 23/49816; H01L 21/4878; H01L 23/36; H01L 24/49; H01L 2924/01047; H01L 2924/01073; H01L 2924/181; H01L 2924/01039; H01L 2924/014; H01L 24/14; H01L 2224/48227
See application file for complete search history.

(56) References Cited

U.S. PATENT DOCUMENTS

| | | | |
|---|---|---|---|
| 4,603,374 A | 7/1986 | Wasielewski | |
| 4,715,115 A | 12/1987 | King et al. | |
| 5,222,014 A | 6/1993 | Lin | |
| 5,309,011 A | 5/1994 | Tazunoki et al. | |
| 5,355,580 A | 10/1994 | Tsukada | |
| 5,488,200 A | 1/1996 | Tsukada | |
| 5,618,759 A | 4/1997 | Boysel | |
| 5,698,452 A * | 12/1997 | Goossen | H04B 10/114 |
| | | | 148/DIG. 135 |

(Continued)

OTHER PUBLICATIONS

Johnson, "STATS ChipPAC Expands eWLB to Reconstituted 300 mm Wafers," *Semiconductor International*, published Apr. 15, 2010, updated Apr. 29, 2010, URL=http://english.ime.cas.cn/ns/es/201004/t20100429_53569.html, 2 pages.

*Primary Examiner* — Marcos D. Pizarro
*Assistant Examiner* — Tenley H Schofield
(74) *Attorney, Agent, or Firm* — Seed IP Law Group LLP

(57) ABSTRACT

A wafer level chip scale package (WLCSP) with portions that have different thicknesses. A first passive surface of a die in the WLSCP includes a plurality of surfaces. The plurality of surfaces may include inclined surfaces or flat surfaces. Thicker portions of die, with more semiconductor material remaining are non-critical portions that increase a WLCSP's strength for further processing and handling after formation, and the thinner portions are critical portions that reduce a Coefficient of Thermal Expansion (CTE) mismatch between a WLCSP and a PCB.

20 Claims, 9 Drawing Sheets

(56) References Cited

U.S. PATENT DOCUMENTS

| | | | |
|---|---|---|---|
| 5,936,843 A | 8/1999 | Ohshima et al. | |
| 5,963,794 A | 10/1999 | Fogal et al. | |
| 6,175,160 B1 | 1/2001 | Paniccia et al. | |
| 6,215,193 B1 | 4/2001 | Tao et al. | |
| 6,232,667 B1 | 5/2001 | Hultmark et al. | |
| 6,253,992 B1 | 7/2001 | Fjelstad | |
| 6,271,469 B1 | 8/2001 | Ma et al. | |
| 6,344,682 B1 | 2/2002 | Tomita | |
| 6,350,668 B1 | 2/2002 | Chakravorty | |
| 6,461,897 B2 | 10/2002 | Lin et al. | |
| 6,469,376 B2 | 10/2002 | Vaiyapuri | |
| 6,607,938 B2 | 8/2003 | Kwon et al. | |
| 6,627,983 B2 | 9/2003 | Tu et al. | |
| 6,680,529 B2 | 1/2004 | Chen et al. | |
| 6,717,245 B1 | 4/2004 | Kinsman et al. | |
| 6,730,543 B2 | 5/2004 | Akram | |
| 6,744,141 B2 | 6/2004 | Kimura | |
| 6,777,797 B2 | 8/2004 | Egawa | |
| 6,781,243 B1 | 8/2004 | Li et al. | |
| 6,787,916 B2 | 9/2004 | Halahan | |
| 6,798,055 B2 | 9/2004 | Vaiyapuri | |
| 6,828,665 B2 | 12/2004 | Pu et al. | |
| 6,858,938 B2 | 2/2005 | Michii | |
| 6,882,054 B2 | 4/2005 | Jobetto | |
| 6,940,169 B2 | 9/2005 | Jin et al. | |
| 7,045,899 B2 | 5/2006 | Yamane et al. | |
| 7,067,911 B1 | 6/2006 | Lin et al. | |
| 7,141,873 B2 | 11/2006 | Aoyagi | |
| 7,193,301 B2 | 3/2007 | Yamaguchi | |
| 7,489,032 B2 | 2/2009 | Jobetto | |
| 7,714,453 B2 | 5/2010 | Khan et al. | |
| 7,772,687 B2 | 8/2010 | Inoue | |
| 7,871,861 B2 | 1/2011 | Song et al. | |
| 7,989,707 B2 | 8/2011 | Yamano et al. | |
| 8,003,496 B2 | 8/2011 | Oh et al. | |
| 8,004,092 B2 | 8/2011 | Lin et al. | |
| 8,106,495 B2 | 1/2012 | Kajiki | |
| 8,125,066 B1 | 2/2012 | Kang | |
| 8,158,888 B2 | 4/2012 | Shen et al. | |
| 8,436,255 B2 | 5/2013 | Goh | |
| 8,466,997 B2 | 6/2013 | Goh et al. | |
| 8,502,394 B2 | 8/2013 | Goh | |
| 8,535,980 B2 | 9/2013 | Chua et al. | |
| 8,884,422 B2 | 11/2014 | Goh et al. | |
| 8,937,008 B2 | 1/2015 | Jin | |
| 2002/0070443 A1 | 6/2002 | Mu et al. | |
| 2003/0148552 A1 | 8/2003 | Halahan | |
| 2003/0162325 A1 | 8/2003 | Tan et al. | |
| 2004/0033643 A1 | 2/2004 | Odegard et al. | |
| 2004/0070000 A1* | 4/2004 | Ng | H01L 33/20 257/745 |
| 2004/0075164 A1 | 4/2004 | Pu et al. | |
| 2005/0041134 A1 | 2/2005 | Takayama | |
| 2005/0121764 A1 | 6/2005 | Mallik et al. | |
| 2005/0127500 A1* | 6/2005 | Colgan | H01L 23/367 257/E23.102 |
| 2005/0133241 A1* | 6/2005 | Chi | H01L 24/83 174/521 |
| 2005/0146051 A1 | 7/2005 | Jobetto | |
| 2005/0156187 A1* | 7/2005 | Isokawa | H01L 24/32 257/E23.07 |
| 2005/0161823 A1 | 7/2005 | Jobetto et al. | |
| 2005/0173024 A1 | 8/2005 | Brennan et al. | |
| 2005/0199995 A1 | 9/2005 | Nomoto et al. | |
| 2005/0277293 A1 | 12/2005 | Kim et al. | |
| 2006/0012022 A1* | 1/2006 | Ararao | H01L 29/0657 257/E29.022 |
| 2006/0091521 A1* | 5/2006 | Cady | H05K 1/141 257/E25.023 |
| 2006/0256222 A1 | 11/2006 | Tsai | |
| 2007/0090508 A1 | 4/2007 | Lin et al. | |
| 2007/0181989 A1 | 8/2007 | Corisis et al. | |
| 2008/0017968 A1 | 1/2008 | Choi et al. | |
| 2008/0029847 A1* | 2/2008 | Guillermo | H01L 21/6836 257/E29.022 |
| 2008/0067634 A1* | 3/2008 | Swee Seng | H01L 24/32 257/E23.125 |
| 2008/0083988 A1 | 4/2008 | Lin | |
| 2008/0106914 A1* | 5/2008 | Wei | G02B 6/0028 362/621 |
| 2008/0157329 A1 | 7/2008 | Inoue | |
| 2009/0057895 A1 | 3/2009 | Lin et al. | |
| 2009/0127688 A1 | 5/2009 | Lee et al. | |
| 2009/0212412 A1 | 8/2009 | Yoon | |
| 2009/0321954 A1* | 12/2009 | Oh | H01L 25/0657 257/777 |
| 2009/0322437 A1 | 12/2009 | Avni et al. | |
| 2010/0072600 A1 | 3/2010 | Gerber | |
| 2010/0090323 A1 | 4/2010 | Shinoda et al. | |
| 2010/0117212 A1 | 5/2010 | Corisis et al. | |
| 2010/0148316 A1 | 6/2010 | Kim et al. | |
| 2010/0244263 A1 | 9/2010 | Lin et al. | |
| 2010/0308442 A1* | 12/2010 | Naka | H01L 24/11 257/620 |
| 2011/0024905 A1 | 2/2011 | Lin et al. | |
| 2011/0032400 A1 | 2/2011 | Yang | |
| 2011/0114978 A1* | 5/2011 | Kojima | H01L 24/95 257/98 |
| 2011/0156230 A1 | 6/2011 | Goh | |
| 2011/0156240 A1 | 6/2011 | Luan et al. | |
| 2011/0156250 A1 | 6/2011 | Goh et al. | |
| 2011/0157452 A1 | 6/2011 | Goh et al. | |
| 2011/0157853 A1 | 6/2011 | Goh | |
| 2011/0260303 A1 | 10/2011 | Pagaila et al. | |
| 2011/0278717 A1 | 11/2011 | Pagaila et al. | |
| 2011/0291274 A1 | 12/2011 | Meyer et al. | |
| 2011/0316146 A1 | 12/2011 | Pagaila et al. | |
| 2011/0316156 A1 | 12/2011 | Pagaila et al. | |
| 2012/0049364 A1 | 3/2012 | Sutardja et al. | |
| 2012/0280261 A1* | 11/2012 | Tarsa | H01L 24/32 257/79 |
| 2014/0091458 A1 | 4/2014 | Van Gemert et al. | |
| 2015/0181697 A1* | 6/2015 | Goida | H01L 24/32 361/728 |
| 2018/0277512 A1* | 9/2018 | Waidhas | H01L 21/6835 |

* cited by examiner

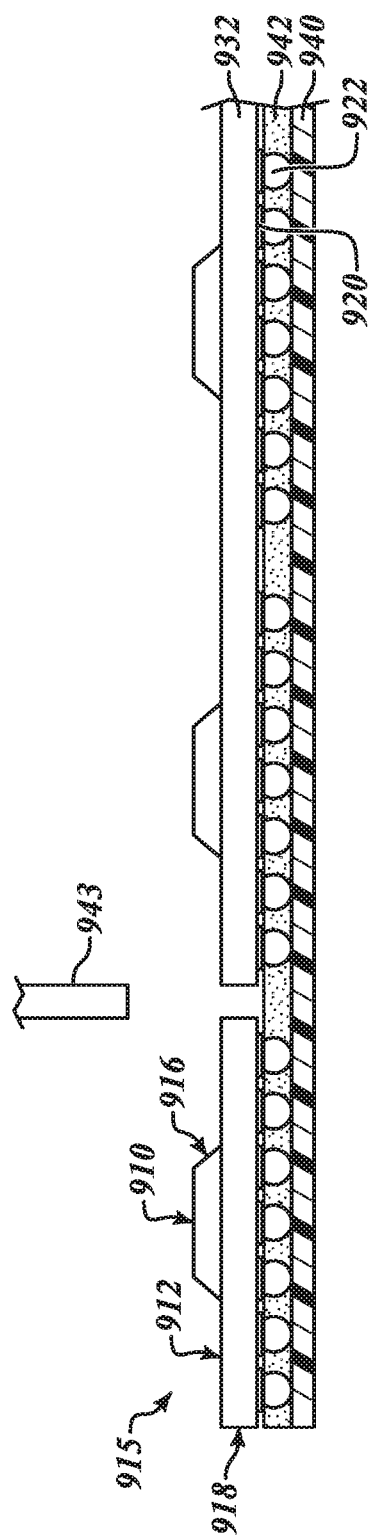
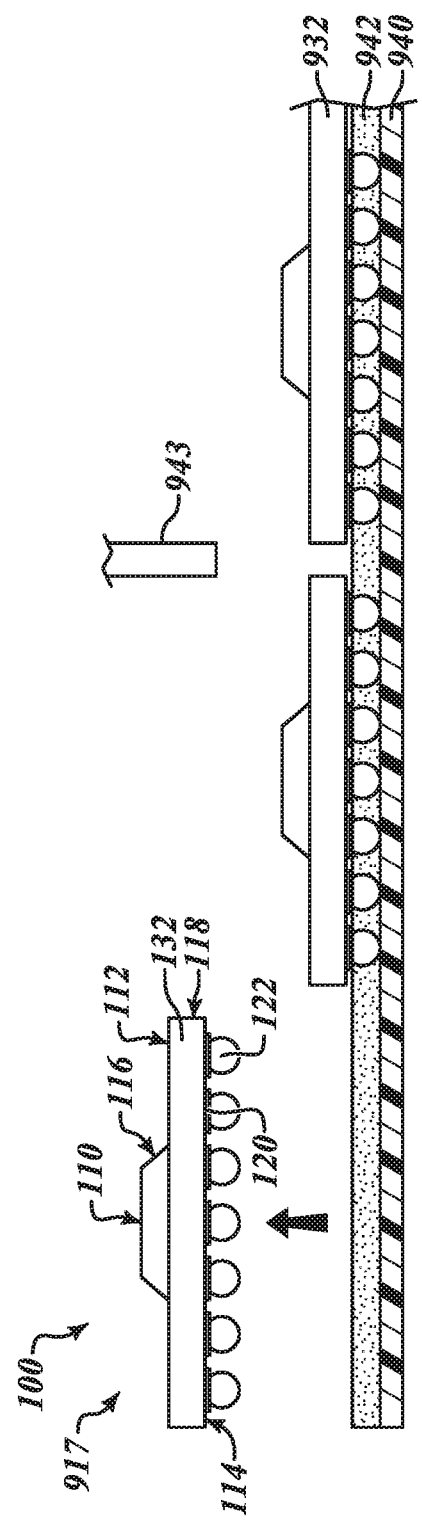

WAFER LEVEL CHIP SCALE PACKAGE HAVING VARYING THICKNESSES

BACKGROUND

Technical Field

The present disclosure is directed to a Wafer Level Chip Scale Package (WLCSP) with a thickness that varies.

Description of the Related Art

Generally, WLCSP are manufactured by coupling solder balls to an active side of a semiconductor wafer. The solder balls are then coupled to an adhesive tape to support the wafer during singulation into individual WLCSP. The wafer is then singulated into individual WLCSP through sawing, cutting, etching, or some other singulation technique. After the wafer has been singulated, the singulated WLCSPs are removed from the adhesive tape. These individual WLCSPs may be coupled to a printed circuit board (PCB) for use and mounting within an electronic device.

As the demand for manufacturing smaller sized and lower profiled semiconductor packages increases for smaller and lower profiled electronics, there are significant challenges to produce WLCSPs with high pin counts, smaller sizes, and lower profiles.

One significant challenge in producing smaller sized and lower profiled WLCSPs, is achieving high Board Level Reliability (BLR) against temperature cycling on board (TCOB) due to mismatches of coefficients of thermal expansion (CTE) between a WLCSP and a PCB. Generally, the PCB has a much higher CTE than the WLCSP. This CTE mismatch between the PCB and the WLCSP can result in damage to the WLCSP and electronic components in the WLCSP that can cause the WLCSP to fail or reduce in efficiency. The life expectancy of the WLCSP due to temperature cycling is significantly reduced because of this CTE mismatch between the WLCSP and the PCB.

Another significant challenge is processing and handling smaller and thinner WLCSPs. The thinner WLCSPs are more susceptible to damage caused by external stresses and forces. For example, small external forces such as dropping the WLCSP during handling, shifting during shipment, rapid changes in temperature, or other such similar external forces or stresses may cause significant damage to the small and thin WLCSP.

BRIEF SUMMARY

The present disclosure is directed to various wafer level chip scale packages (WLCSP) that have critical portions that are thin and non-critical portions that are thicker than the critical portions. In this context, critical describes portions of a die of the WLCSP where the die is likely to bend or flex due to heat or thermal exposure that can result in damage to the die or components within the die. The non-critical portions describe areas where the die is not likely to bend or flex due to heat or thermal exposure. These thin portions reduce the CTE mismatch between the WLCSP and a printed circuit board (PCB) increasing the board level reliability (BLR) of the WLCSP against temperature cycling on board (TCOB). In addition, the thicker portions allow for further processing and handling of the WLCSP such as pick and place for coupling the WLCSP to the PCB. This WLCSP with thinner portions and thicker portions can be manufactured using semiconductor manufacturing techniques such as utilizing an adhesive tape, etching techniques, and singulating techniques.

According to one embodiment of a WLCSP, the WLCSP includes a die, passivation layers, redistribution layers (RDL), under bump metallizations (UBM), and solder balls coupled to the UBMs. The WLCSP includes a first surface that is passive and a second surface that is around the first surface, the second surface also being passive. The WLSCP includes a third surface opposite to the first and second surfaces, the third surface being active. The first surface is further from the third surface than the second surface. A fourth surface extends from the first surface to the second surface. The third surface includes contact pads or UBMs. In addition, solder balls are coupled to the contact pads or UBMs on the third surface. Sidewalls extend between the second surface and the third surface.

This embodiment of the WLCSP further includes a first portion, a second portion, and a third portion. The first portion has a first thickness that extends between the third surface and the first surface. The second portion has a second thickness that extends between the third surface and the second surface. The third portion has a third thickness that extends between the third surface and the fourth surface. The first thickness of the first portion is greater than the second thickness of the second portion. The first portion and the second portion are separated from and coupled to each other by the third portion. The third thickness of the third portion varies between the second thickness and the first thickness. The fourth surface extends from the second surface to the first surface at an incline. The first portion being thicker than the second portion means that the first portion extends in an outward direction from the second surface of the WLCSP. The first portion is a critical portion, the second portion is a non-critical portion, and the third portion is a transition portion. The first portion is positioned at a center of the WLCSP and is surrounded by the second portion and the third portion. The critical portions include features that are susceptible to damage in response to stresses or thermal exposure that cause flexing, bending, or other similar distortions.

In this embodiment, the thicker non-critical portion makes the WLCSP stronger at a center of the WLCSP allowing for further processing and handling, such as picking and placing the WLCSP on a PCB or shipping the WLCSP. In other words, this thicker non-critical portion allows for the WLCSP to have a greater resistance against external forces because the non-critical portions are thicker. This increase in strength and thickness reduces the likelihood of damage to the WLCSP caused by external stresses and forces during further handling, processing, shipping, or other similar processes.

In this embodiment, the thinner critical portion reduces a CTE mismatch between the PCB and this embodiment of the WLCSP when the WLCSP is mounted to the PCB. This reduction in the CTE mismatch between the PCB and this embodiment of the WLCSP improves the BLR of the WLCSP by increasing the WLCSP's tolerance to TCOB. This embodiment of the WLCSP is more tolerant to bending, warping, expansion, and contraction in the PCB and the WLCSP due to changes in temperature that the WLCSP and the PCB are exposed because when the WLCSP and the PCB have similar CTEs, the WLCSP and the PCB bend or flex in a similar ways.

In an alternative embodiment of the WLCSP above, the fourth surface that separates the second surface and the third surface may be vertical instead of inclined.

In another alternative embodiment, a WLCSP may have a first surface, a second surface, and a third surface opposite a fourth surface that includes contacts. The second surface extends from the first surface to a first sidewall, and the third surface extends from the first surface to a second sidewall. The second surface and the third surface are at an incline in this embodiment, which results in the WLCSP having a second portion and a third portion with varying thicknesses. In addition, the WLCSP in this embodiment includes a first portion with a consistent thickness that separates and couples the second portion to the third portion. The first portion is located between the first surface and the fourth surface of the WLCSP.

In another alternative embodiment of the WLCSP, a first portion extends in an outward direction from a surface of the WLCSP and has a plus shape. In this alternative embodiment, the corners of the WLCSP are thinner than the first portion with the plus shape. In addition, the first portion is positioned at the center of the WLCSP and extends from one sidewall to another opposite sidewall.

In another alternative embodiment, a plurality of thicker portions may extend in an outward direction from a surface of the WLCSP. The plurality of thicker portions may have any shape. In addition, this alternative embodiment of the WLCSP may include thinner portions that are aligned with trenches, gaps, or spaces that extend between and pass by the plurality of thicker portions. The thinner portions include a first group of thinner portions that extend in a first direction, and a second group of thinner portions that extend in a second direction that is transverse to the first direction.

The above embodiment and alternative embodiments of a WLCSP with thinner portions and thicker portions are manufactured by a method that includes coupling a wafer to an adhesive tape, etching the wafer, singulating the wafer into individual WLCSPs, and removing the individual and singulated WLCSP.

BRIEF DESCRIPTION OF THE SEVERAL VIEWS OF THE DRAWINGS

In the drawings, identical references numbers identify similar elements or acts unless the context indicates otherwise. The sizes and relative portion of the elements in the drawings are not necessarily drawn to scale.

FIGS. 8A-8E are side plan views of successive steps of a package fabrication process according to the embodiments disclosed.

DETAILED DESCRIPTION

Figure 1A:
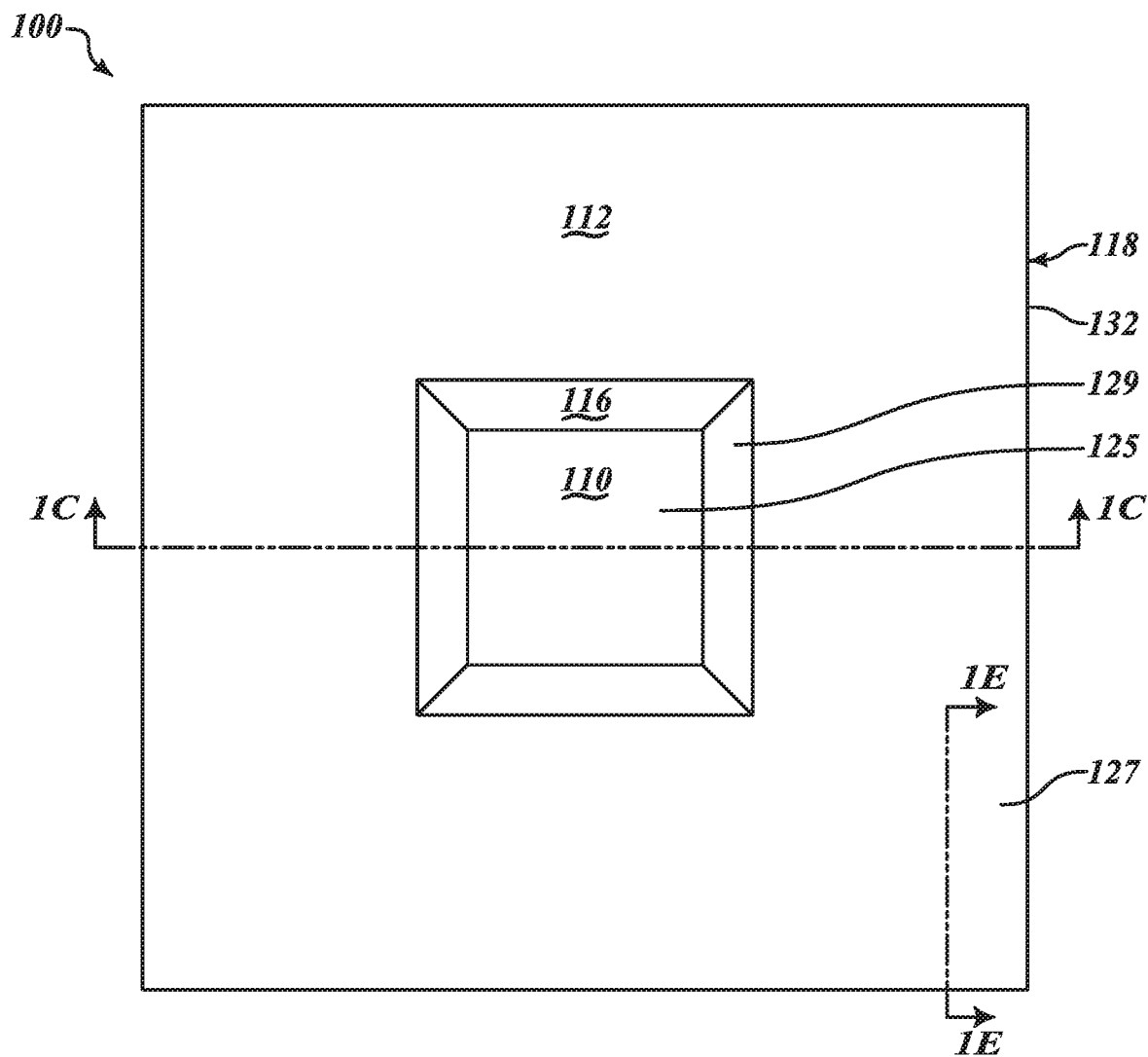
FIG. 1A is a top plan view of an embodiment of a WLCSP.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The present disclosure is directed to a Wafer Level Chip Scale Package (WLCSP) that includes multiple thicknesses on a passive side of a die. For example, FIGS. 1A-1E are directed to one embodiment of a WLCSP 100 including a die 132 that has a first surface 110, a second surface 112, and a third surface 114 on a first side of the die, which is a passive side of the die. The die 132 includes a fourth surface 116 on a second side of the die, the second side being opposite the first side and being an active side of the die 132. The die includes a substrate, likely of semiconductor materials like silicon, silicon germanium, or other suitable materials. The die 132 includes sidewalls 118 extending from the fourth surface 116 to the first surface 112 of the die 132. The fourth surface 116 of the die 132 includes Under Bump Metallizations (UBMs) 120 and solder balls 122 coupled to the UBMs 120. A redistribution layer (RDL) 131 is positioned between the die 132 and the UBMs 120. The die 132 is a silicon material or other suitable semiconductor material. Transistors, resistors, capacitors and other circuitry may be formed in the die 132 with electrical connections that extend to the active side of the die. The passive side of the die does not include any electrical components on the surfaces furthest from the active side of the die.

In this embodiment, the first surface 110, the second surface 112, and the fourth surface 116 are opposite the third surface 114 as shown in FIG. 1A. The die 132 has different thicknesses between the different surfaces. The first surface 110 of the WLCSP 100 is positioned at the center of the die 132 and has a square shape as shown in FIG. 1A, with sides of the square being substantially parallel to respective sides of the die. However, in alternative embodiments, the shape of the first surface can be a circle, an oval, a triangle, a diamond, or any other shape. See FIGS. 2A-2C. Also, in alternative embodiments, the first surface 110 may be positioned at a different location on the WLCSP 100 instead of at the center of the WLCSP 100.

Figure 1B:
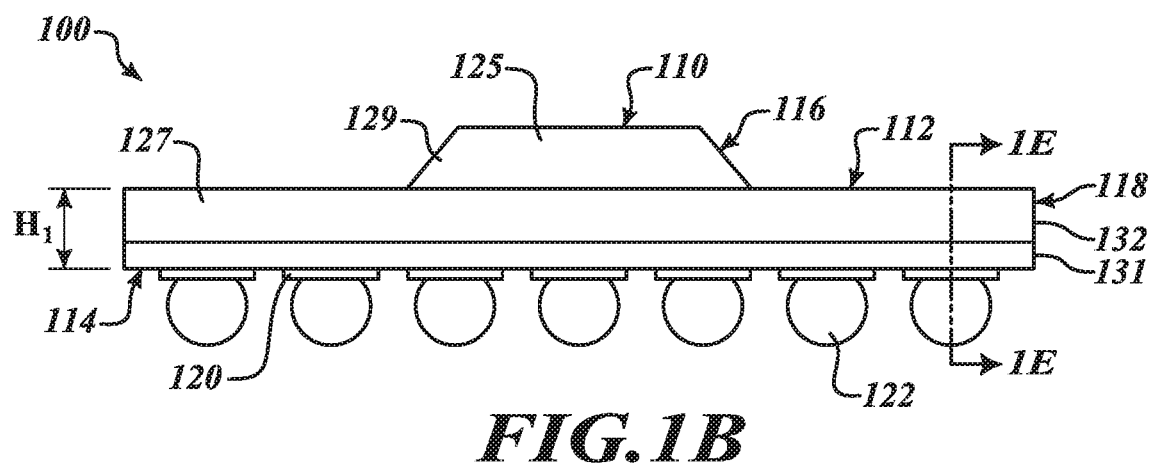
FIG. 1B is a side plan view of the embodiment of the WLCSP in FIG. 1A.

The fourth surface 116 surrounds the first surface 110 and is positioned between the first surface 110 and the second surface 112. The second surface surrounds the first surface 110 and the fourth surface 116 and is positioned between the fourth surface 116 and the sidewalls 118. The fourth surface 116 extends between the first surface 110 and the second surface 112. The fourth surface 116 separates the first surface 110 from the second surface 112. The fourth surface 116 is transverse to the first surface 110, the second surface 112, and the third surface 114. The fourth surface 116 may be at an incline as shown in FIG. 1B. However, in alternative embodiments, the fourth surface 116 may be vertical or substantially perpendicular to the second surface.

The third surface 114 is opposite the first surface 110 and the second surface 112, and the fourth surface 116 is a front side surface or otherwise an active surface where electrical contacts are formed. The first surface 110, the second surface 112, and the fourth surface 116 are a back side surface or otherwise a passive surface that has no electrical contacts. It is possible that there may be a through silicon via or other contact formed to extend to this passive surface. The sidewalls extend between the second surface 112 and the third surface 114. The sidewalls 118 have a first height H1.

Figure 1C:
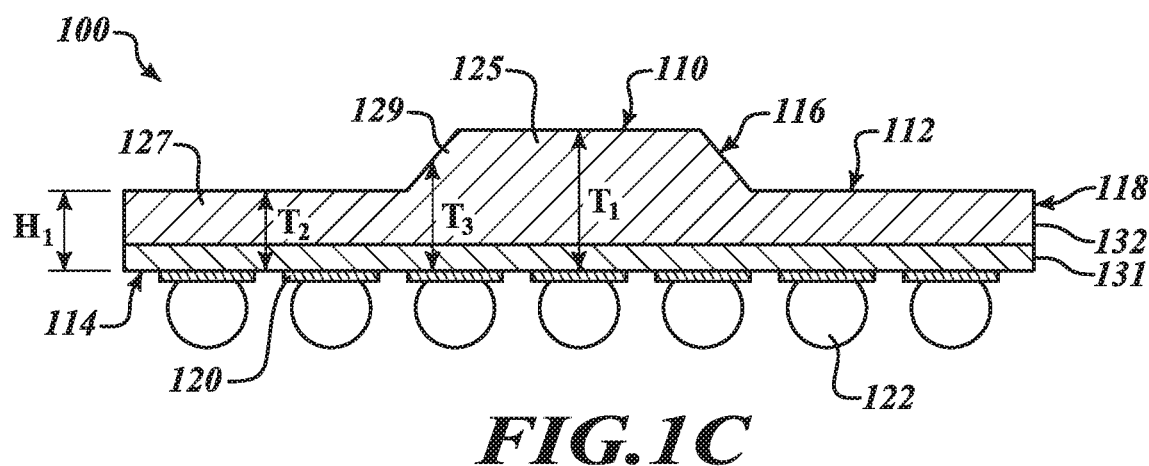
FIG. 1C is a cross-sectional view taken along line 1C-1C in FIG. 1A.
Figure 1D:
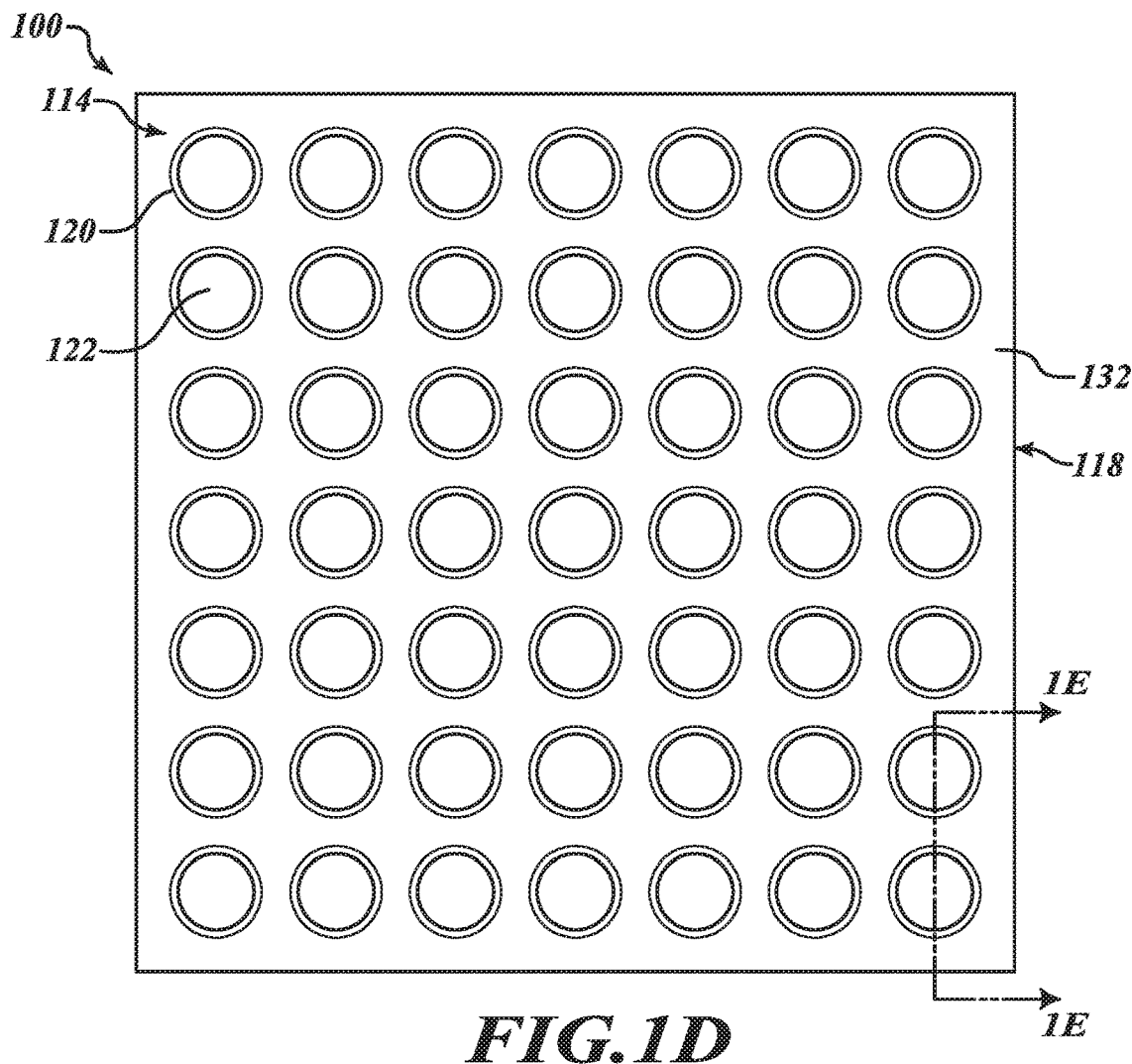
FIG. 1D is bottom plan view of the embodiment of the WLCSP in FIGS. 1A and 1B.

The UBMs 120 are on the third surface 114 as shown in FIGS. 1B-1D. The plurality of solder balls 122 are coupled to the UBMs 120 on the third surface 114. Each respective solder ball 122 is coupled to its own respective UBM 120. The UBMs are illustrated as round in FIG. 1D, however, these UBMs may be square or rectangular or any other suitable shape. The solder balls 122 are utilized to couple the WLCSP 100 to a PCB or to other electronic components within an electronic device such as a smart phone, a tablet, a computer, a calculator, or any other similar electronic device. As shown in FIG. 1D, the plurality of UBMs 120, which may be a plurality of contact pads, bond pads, or some other electronic coupling location, and a plurality of solder balls 122 are in a Ball Grid Array (BGA) configuration on the third surface 114 of the WLCSP 100.

The WLCSP 100 includes a plurality of portions 125, 127, 129 as shown in FIGS. 1A-1C. The plurality of portions includes a first portion 125, a second portion 127, and a third portion 129. The first portion 125 is located between the first surface 110 and the third surface 114 and has a first thickness T1 that extends between the first surface 110 and the third surface 114. The second portion 127 is located between the second surface 112 and the third surface 114 and has a second thickness T2 that extends between the second surface 112 and the third surface 114. The third portion 129 is located between the third surface 114 and the fourth surface 116 and has a third thickness T3 that extends between the third surface 114 and the fourth surface 116.

The third thickness T3 is a variable thickness that varies between the first thickness T1 and the second thickness T2. The first thickness T1 of the first portion 125 is greater than the second thickness T2 of the second portion 127. The second portion 127 surrounds the first portion 125 and the third portion 129 of the WLCSP 100. The second portion 127 is thinner than the first portion 125 and forms a perimeter or a boundary around the first portion 125 and the third portion 129. The second portion 127 is positioned adjacent to and along the sidewalls 118. The first portion 125 is positioned at the center of the WLCSP 100. The third portion 129 surrounds the first portion 125 and separates and couples the first portion 125 to the second portion 127. The third portion 129 acts as a transition portion between the first portion 125 and the second portion 127. The first portion 125 is a non-critical portion and the second portion 127 is a critical portion. This critical portion is a location where bending and flexing can result due to heat or thermal exposure. This heat or thermal exposure that results in bending and flexing can cause cracks in the die 132, mechanical failures of electrical components in the die 132, or short circuiting between electrical components in the die 132.

The first thickness T1 of the non-critical portion 125 may be 200-400 microns and the second thickness T2 of the critical portion 127 may be 100-150 microns. However, in other alternative embodiments, the thicknesses of the non-critical portion 125 and the critical portion 127 may have different values than those discussed directly above. The first surface 110, which is shaped like a square may have a 2×2 mm area. However, in other alternative embodiments, the first surface may have an area with different dimensions.

A benefit of the WLCSP 100 of the present disclosure is when further processing or shipping this embodiment of the WLCSP 100, the non-critical portion 125, which is thicker than the critical portion 127, causes the WLCSP 100 to be stronger and more resistant to external stresses and forces at the center because the WLCSP is thicker at the center. The more stress and force resistant center of the WLCSP 100 at the non-critical portion 125 allows for the WLCSP 100 to be picked up at the non-critical portion 125 and placed on a PCB, placed in a shipment container, or shipped to a customer while reducing the likelihood of damage caused by external stresses or forces. These external stresses or forces are those that the WLCSP 100 is exposed to during the above processes or other similar processes. The non-critical portion 125 also increases the stress resistance of the WLCSP 100 when it is mounted within an electronic device as well because of the non-critical portion's 125 greater resistance to external forces.

An alternative benefit of the WLCSP 100 of the present disclosure is when a WLCSP 100 is mounted or coupled to a PCB, the critical portion 127 of the WLCSP 100, which is thinner than the non-critical portion 125, reduces a difference between a first coefficient of thermal expansion (CTE) of the WLCSP 100 and a second CTE of the PCB because the WLCSP 100 is thinner at the critical portion 127 than the non-critical portion 125. By reducing this difference between the first CTE and the second CTE, which may be called a CTE mismatch, when the WLCSP 100 and the PCB are mounted within an electronic device and exposed to changes in temperature that are rapid or slow, the WLCSP 100 and the PCB will expand, warp, contract, and bend in similar ways. This similarity in expansion, contraction, warping, and bending will reduce damage that results from the PCB expanding more quickly or slowly than the WLCSP 100 and vice versa. By reducing the CTE mismatch between the WLCSP 100 and the PCB, the board level reliability (BLR) of the WLCSP 100 when exposed to temperature cycling on board (TCOB) is increased causing the life span of the WLCSP 100 to be longer. This reduction in the CTE mismatch also reduces the chance of damage that could cause a failure or reduce efficiency of the WLCSP 100 or the PCB when in use in an electronic device due to temperature changes.

An alternative benefit of the WLCSP 100 of the present disclosure is that the non-critical portion 125 and critical portion 127 allow for the WLCSP 100 to be made even thinner.

Even though these benefits are not discussed with respect to each and every embodiment or alternative embodiment of a WLCSP with varying thicknesses of the present disclosure, these benefits apply to each and every embodiment of a WLCSP disclosed in the present disclosure.

Figure 1E:
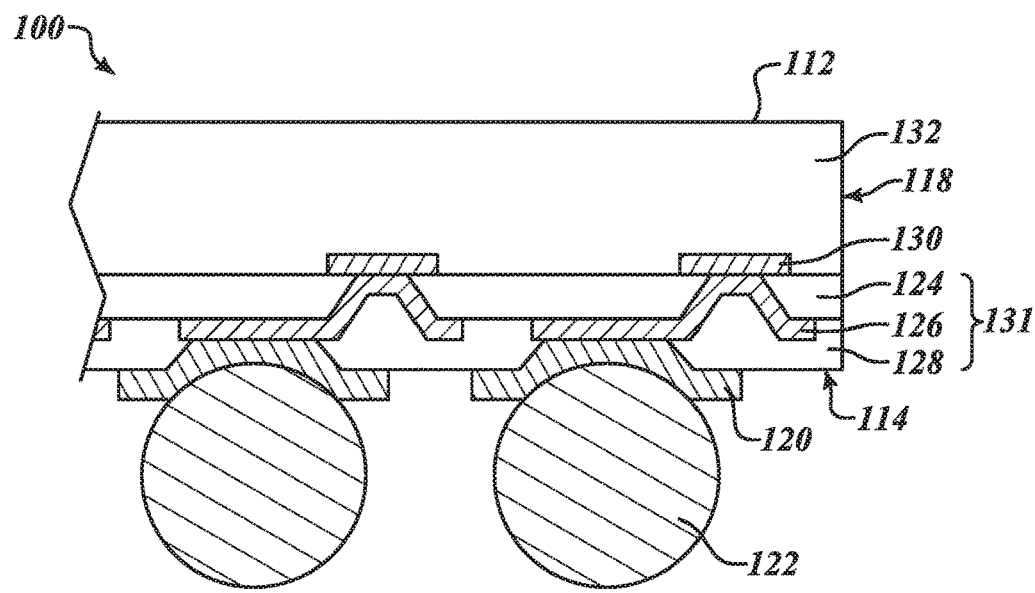
FIG. 1E is cross-sectional view of the embodiment of the WLCSP in FIG. 1A taken along line 1E-1E in FIGS. 1A, 1B, and 1D.

FIG. 1E is an enhanced view of the die 132 through cross section 1E-1E in FIGS. 1A, 1B, and 1D. The WLCSP 100 includes the die 132 having a plurality of bond pads or contact pads 130 that are coupled to a variety of active and passive circuitry in the die (not shown). In addition, the WLCSP 100 includes a redistribution layer (RDL) 131 that includes a first dielectric layer 124, a conductive layer 126, and a second dielectric layer 128. The RDL 131 couples the bond pads 130 from the die to the UBMs 120 and ultimately to the outside world. The UBMs 120 are coupled to the RDL 131 and the solder balls 122 is coupled to the UBMs 120.

The bond pads 130 are electrically coupled to the RDL 131 and the RDL 131 is electrically coupled to the UBMs 120. The first dielectric layer 124 of material is positioned between the die 132 and the conductive layer 126. The first dielectric layer 124 may be a polyimide layer, a passivation layer, or some other layer of non-conductive or insulating material. The conductive layer 126 may be a copper material, a gold material, a metal alloy, or some other conductive material. The second dielectric layer 128 of material is positioned between the conductive layer 126 and the UBMs 120. The second dielectric layer 128 may be a polyimide layer, a passivation layer, or some other layer of non-conductive or insulating material. The solder balls 122 are coupled to the UBMs 120 as discussed earlier with respect to FIGS. 1B and 1D.

The bond pads 130 of the die 132, the conductive layer 126, the UBMs 120, and the solder balls 122 are electrically coupled together. The bond pads 130, the conductive layer 126, the UBMs 120, and the solder ball 122 can be used to electrically couple the die 132 to other external electronic components or semiconductor components such as another semiconductor die, a PCB, or some other electronic device that the WLCSP 100 may be mounted or coupled. The solder balls 122 also physically couple the WLCSP 100 to an external electronic or semiconductor component.

The first dielectric layer 124 positioned between the die 132 and the conductive layer 126 electrically isolates bond pads 130 and portions of the conductive layer 126 from other respective bond pads 130 and respective portions of the conductive layer 126 to avoid cross talk between bond pads 130 and portions of the conductive layer 126. Cross talk occurs when two electronic components within a WLCSP become electrically coupled to one another due to a defect or damage in the WLCSP, which can reduce efficiency of the WLCSP, cause the WLCSP to completely fail, or reduce the WLCSP's life span.

The second dielectric layer 128 positioned between the UBMs 120 and the conductive layer 126 electrically isolates portions of the conductive layer 126 and UBMs 120 from other respective portions of the conductive layer 126 and UBMs 120 to avoid cross talk between portions of the conductive layer 126 and UBMs 120. This is similar to how the first dielectric layer 124 isolates the bond pads 130 and portions of the conductive layer 126 from other bond pads 130 and portions of the conductive layer 126 as discussed earlier with respect to the first dielectric layer 124. The second dielectric layer 128 also helps in the formation of the UBMs 120, which will be discussed directly below.

The first dielectric layer 124, the conductive layer 126, and the second dielectric layer 128 are formed by a plurality of etching and masking steps. The first dielectric layer 124 may be formed by first placing a passivation material on of the die 132. After placing the passivation material, a mask material is placed on the passivation material leaving certain areas of the passivation material exposed and covering other areas of the passivation material. The mask material may be a photoresist mask, a hard mask, or some other mask material. After the mask material is placed, the passivation material is etched. This etching may be a chemical etching, a plasma etching, a radiation etching, or some other etching technique. The mask material protects the portions of the passivation layer that it covers from being removed. After the etching step is complete, the mask material is removed leaving the first dielectric layer 124. This process is then repeated to form the conductive layer 126, the second dielectric layer 128, and the UBM 120 of the WLCSP 100. Alternatively, the first dielectric layer 124, the conductive layer 126, the second dielectric layer 128, and the UBMs 120 of the WLCSP 100 may be formed using a flip chip process.

Figure 2A:
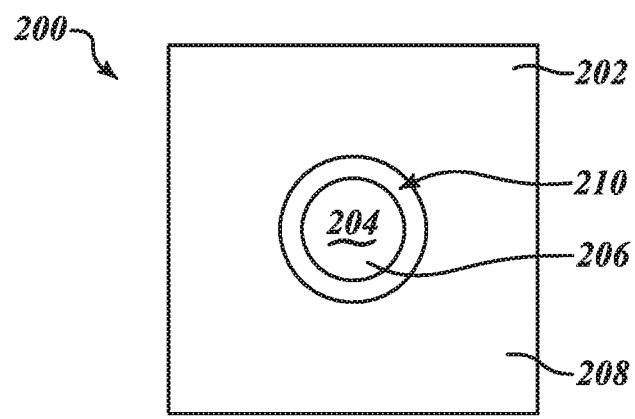
FIGS. 2A-2C are alternative embodiments of a WLCSP.
Figure 2B:
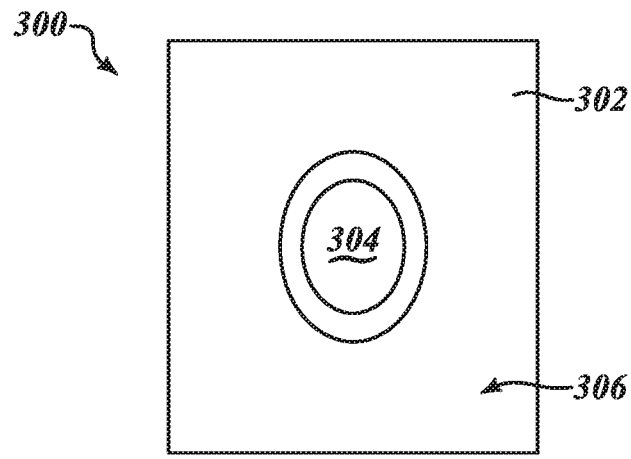
Figure 2C:
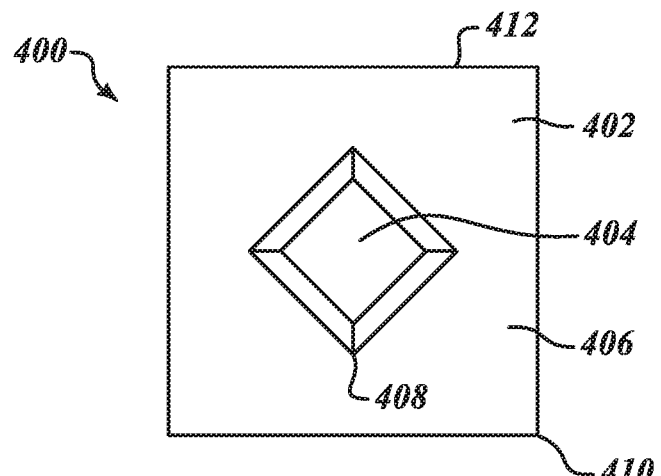

FIGS. 2A-2C are directed to alternative embodiments of a WLCSP 200, 300, 400 having various thicknesses of a die in a package. The WLCSP 200 includes a die 202 having a circle-shaped first surface 204 of a thicker portion 206, as shown in FIG. 2A. The thicker portion 206 has a greater thickness in cross-section as compared to a thinner portion 208, which surrounds the thicker portion 206. The die 202 includes a surface 210 between the thicker portion 206 and the thinner portion 208, which may be angled due to processing steps.

The WLCSP 300 includes a die 302 having an oval-shaped first surface 304 as shown FIG. 2B. The oval-shaped first surface 304 is a surface of the thickest part of the die 302, as measured from an active surface of the die 302. A second surface 306 is a surface of the thinnest portion of the die 302.

The WLCSP 400 includes a die 402 that has a diamond-shaped first portion 404 as shown in FIG. 2C. This first portion 404 is thicker than a second portion 406, which surrounds the first portion 404. Corners or points 408 of the first portion 404 are not aligned with corners 410 of the die 402. Instead the corners 408 are aligned in a middle region of sides 412 of the die 402. The alternative embodiment of the WLCSP 400 in FIG. 2C with the diamond-shaped first surface is similar to the embodiment disclosed in FIG. 1A as discussed earlier, but in this alternative embodiment of the WLCSP 400, the square-shaped first surface 110 is rotated with respect to the corners 410 of the die 402.

Figure 3A:
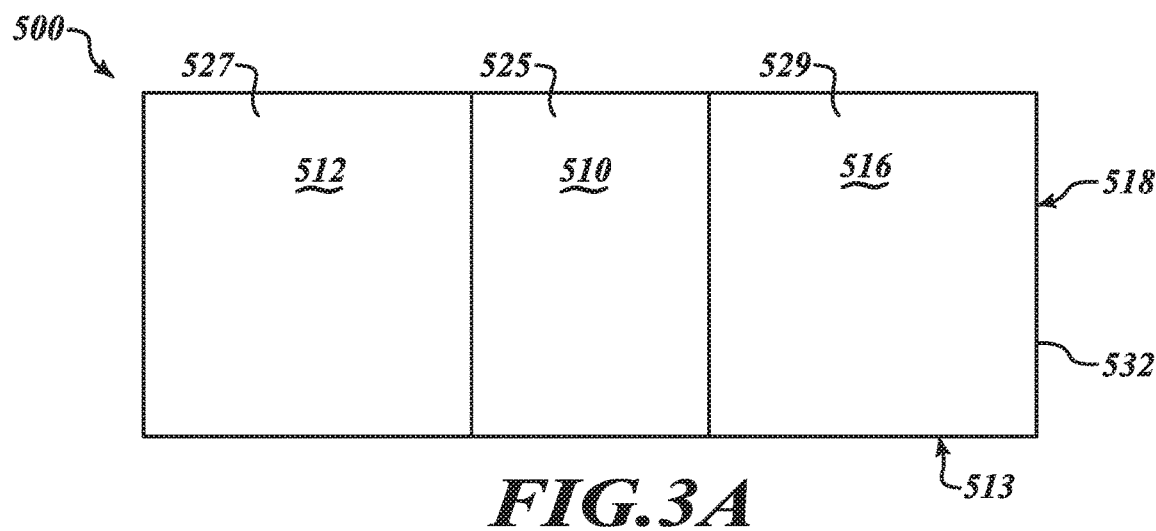
FIG. 3A is a top plan view of an alternative embodiment of a WLCSP.
Figure 3B:
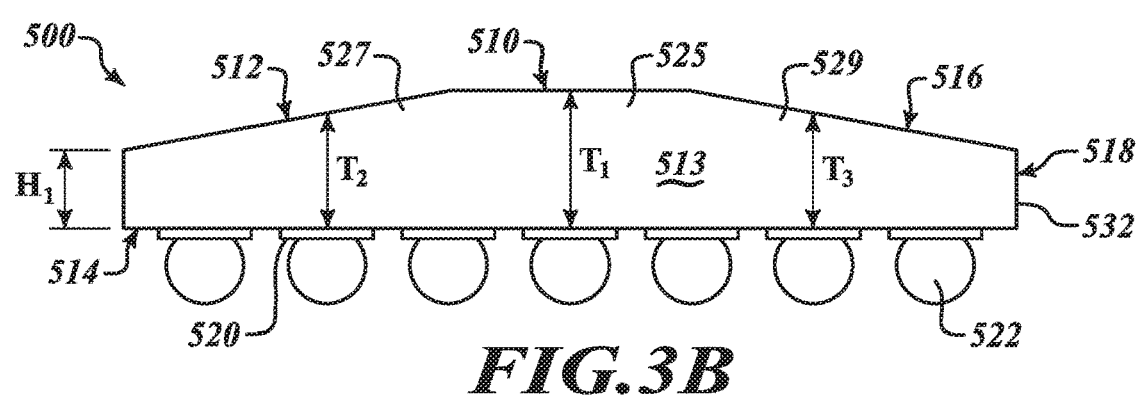
FIG. 3B is a side plan view of the alternative embodiment of the WLCSP in FIG. 3A.

FIGS. 3A-3B are directed to an alternative embodiment of a WLCSP 500 including a die 532, a first surface 510, a second surface 512, a third surface 516, a fourth surface 514, first sidewalls 518, second sidewalls 513, a plurality of UBMs 520, and a plurality of solder balls 522.

In this alternative embodiment, the first surface 510, the second surface 512, and the third surface 516 are opposite the fourth surface 514. The first surface 510 is positioned at a center of the WLCSP 500. However, in alternative embodiments, the first surface 510 may be in a different position on the WLCSP 500. The first surface separates and couples the second surface 512 to the third surface 516. The second surface extends between the first surface 510 and one of the first sidewalls 518 of the plurality of sidewalls 513, 518. The third surface 516 extends between the first surface 510 and another of the first sidewalls 518 of the plurality of sidewalls 513, 518. The first surface 510, the second surface 512, and the third surface 516 extend between one of the second sidewalls 513 and another of the second sidewalls 513. The first sidewalls 518 have a rectangular shape and the second sidewalls 513 have a trapezoidal shape on a rectangular shape or otherwise a non-rectangular shape. However, in alternative embodiments, the first sidewalls 518 and the second sidewalls may have different shapes. The second surface 512 and the third surface 516 are at an incline. The incline of the second surface 512 and the third surface 516 may be the same or may be different.

The UBMs 520 are on the fourth surface 514. The solder balls 522 are coupled to the UBMs 520 on the fourth surface 514. The die includes an RDL, not shown in these figures. Each respective solder ball 522 is coupled to its own respective UBM 520. The solder balls 522 are utilized to couple the WLCSP 500 to a PCB or to other electronic components within an electronic device such as a smart phone, a tablet, a computer, a calculator, or any other similar electronic device. The plurality of UBMs 520, which may be a plurality of contact pads, bond pads, or some other electronic coupling location, and a plurality of solder balls 522 are in a Ball Grid Array (BGA) configuration on the fourth surface 514. The plurality of solder balls 522 are coupled to the plurality of UBMs 520. Each respective solder ball 522 of the plurality of solder balls 522 is coupled to a respective UBM 520 of the plurality of UBMs 520. The UBMs 520 couple the WLCSP 500 and the die 532 of the WLCSP 500 electrically and physically to other electronic components or semiconductor devices.

The WLCSP 500 has a first thickness T1 that extends between the first surface 510 and fourth surface 514, the first thickness T1 is a consistent thickness that remains the same at any location positioned between the first surface 510 and the fourth surface 514. The WLCSP 500 has a second thickness T2 that extends between the second surface 512 and the fourth surface 514. The second thickness T2 is a varying thickness that varies between a first height H1 of the sidewalls 518 and the first thickness T1. The WLCSP 500 has a third thickness T3 that extends between the third surface 516 and the fourth surface 514, the third thickness T3 is a varying thickness that varies between the first height H1 of the first sidewalls 518 and the first thickness T1. The surfaces 510, 512, 514, 516 and the thicknesses T1, T2, T3 of the WLCSP 500 define a plurality of portions of the WLCSP 500.

The plurality of portions 525, 527, 529 includes a first portion 525, a second portion 527, and a third portion 529. The first portion 525 is located between the first surface 510 and the fourth surface 514 and has the first thickness T1. The second portion 527 is located between the second surface 512 and the fourth surface 514 and has the second thickness T2. The second thickness T2 reduces in thickness as the second portion 527 of the WLCSP 500 extends from the first portion 525 toward the first sidewalls 518. The third portion 529 is located between the third surface 516 and the fourth surface 514 and has a third thickness T3. The third thickness T3 reduces in thickness as the third portion 529 extends from the first portion 525 toward the first sidewalls 518.

The first sidewalls 518 have a first height H1. The first thickness T1 is greater than the first height H1 of the first sidewalls 518. The first portion 525 separates and couples the second portion 527 to the third portion 529. The second portion 527 and the third portion 529 are adjacent to the first portion 525. The second thickness T2 of the second portion 527 and the third thickness T3 of the third portion 529 are variable thicknesses as discussed above. As the second portion 527 extends toward the first sidewalls 518, the second thickness T2 varies between the first thickness T1 of the first portion 525 and the first height H1 of the first sidewalls 518. As the third portion 529 extends toward the first sidewalls, the third thickness T3 varies between the first thickness T1 of the first portion 525 and the first height H1 of the first sidewalls 518. The first portion 525 is positioned at the center of the die 532. The first portion 525 is a non-critical portion and the second portion 527 and the third portion 529 are critical portions.

Similar to the embodiment in FIGS. 1A-1E, this alternative embodiment of the WLCSP 500 includes the die 532 with a bond pad 130. In addition, the WLCSP 500 includes the RDL, not shown in this alternative embodiment. The RDL includes a first dielectric layer between the die 532 and a conductive layer, a second dielectric layer positioned between the conductive layer and the UBMs 520, and the conductive layer positioned between the first and second dielectric layers. The configuration of these components is the same or very similar as discussed above with respect to the RDL of FIG. 1E and as shown in FIG. 1E.

In another alternative embodiment, the WLCSP 500 may not have sidewalls 518, but instead, the second surface 512 and the third surface 516 may extend from the first surface 510 and an edge of the WLCSP 500 that does not have the sidewalls 518. In other words, where a respective second surface 614 meets the third surface forms an edge of the WLCSP 600.

Figure 4:
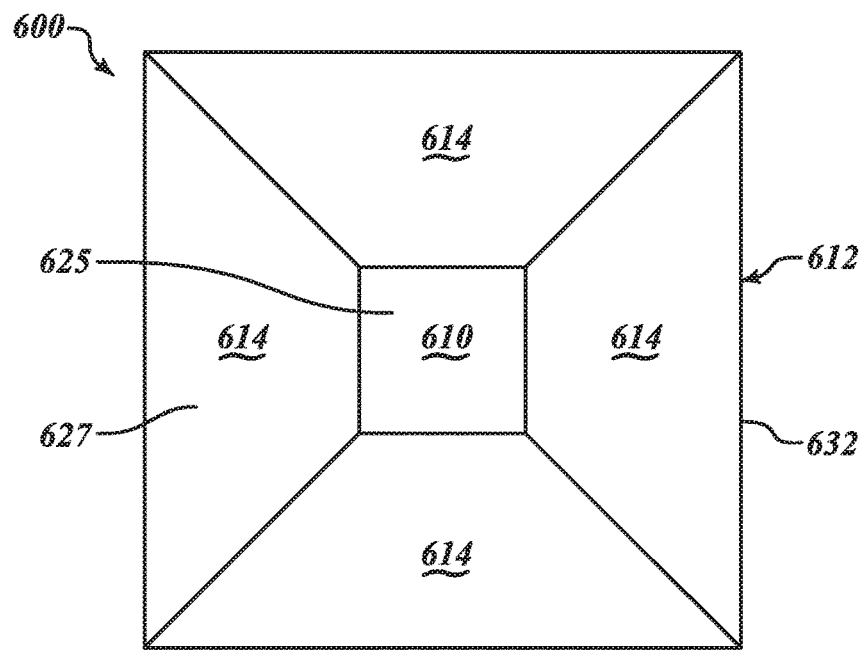
FIG. 4 is a top plan view of an alternative embodiment of a WLCSP.

FIG. 4 is directed to another alternative embodiment of a WLCSP 600. The WLCSP 600 includes a die 632 having a first surface 610, a plurality of second surfaces 614, a third surface opposite the first and second surfaces (not shown), and a plurality of sidewalls 612.

The first surface 610 and the plurality of second surfaces 614 are opposite the third surface, which cannot be seen but is similar to the third surface 114 in FIGS. 1B and 1E. The first surface 610 and the plurality of second surfaces 614 make up a back side surface, which is a passive surface. The third surface makes up a front side surface, which is an active surface. The first surface 610 is positioned at the center of the die 632 and has a square shape. However, in alternative embodiments, the first surface may be a circle, an oval, a rectangle, or some other shape as desired. Each of the respective second surfaces 614 of the plurality of second surfaces 614 extends between the first surface and a respective sidewall of the plurality of sidewalls 612. The second surfaces 614 surround the first surface 610 as shown in FIG. 4. In this alternative embodiment, the second surfaces 614 have a trapezoidal shape. However, in other alternative embodiments, the second surfaces may have a different shape. The second surfaces 614 are at an incline or otherwise vary in thickness between the first surface 610 and the sidewalls. The incline is the same for each of the second surfaces 614 in FIG. 4. However, in other alternative embodiments, the second surfaces may be at different inclines.

The WLCSP 600 has a first thickness that extends between the first surface 610 and the third surface, which, again, cannot be seen but is similar to the third surface 114 in FIGS. 1B and 1E. The WLCSP 600 includes second thicknesses, which are thicknesses that vary. The second thicknesses extend between the second surfaces 614 and the third surface. The first surface 610, the second surfaces 614, and the third surface define a plurality of portions of the WLCSP 600. The plurality of portions 625, 627 includes a first portion 625 and four second portions 627 that surround the first portion 625. The first portion 625 is located between the first surface 610 and the third surface and has the first thickness. The sidewalls 612 have a first height. The first height of the sidewalls 612 is less than the first thickness of the first portion 625. The second portions 627 surround the first portion 625 and form a perimeter or boundary around the first portion 625. The second portions 627 are located between a respective second surface 614 of the plurality of second surfaces 614 and the third surface, and each second portion 627 has a respective variable thickness of the second thicknesses that varies between the first thickness of the first portion 625 and the first height H1 of the sidewalls 612. The first portion 625 is a non-critical portion 625 and the second portions 627 are critical portions 627. This non-critical portion 625 and these critical portions 627 also allow for the WLCSP 600 to be made even thinner.

In another alternative embodiment, the WLCSP 600 may not have sidewalls 612, but instead, the second surfaces 614 may extend between the first surface 610 and an edge of the WLCSP 600 that does not have a sidewall. In other words, where a respective second surface 614 meets the third surface forms an edge of the WLCSP 600.

Similar to the embodiment in FIGS. 1A-1E, this alternative embodiment of the WLCSP 600 includes the die 632 with a bond pad. In addition, the WLCSP 600 includes UBMs, solder balls, and an RDL having a first dielectric layer and a second dielectric layer. The configuration of these components is the same as discussed above with respect to FIG. 1E and as shown in FIG. 1E.

Figure 5A:
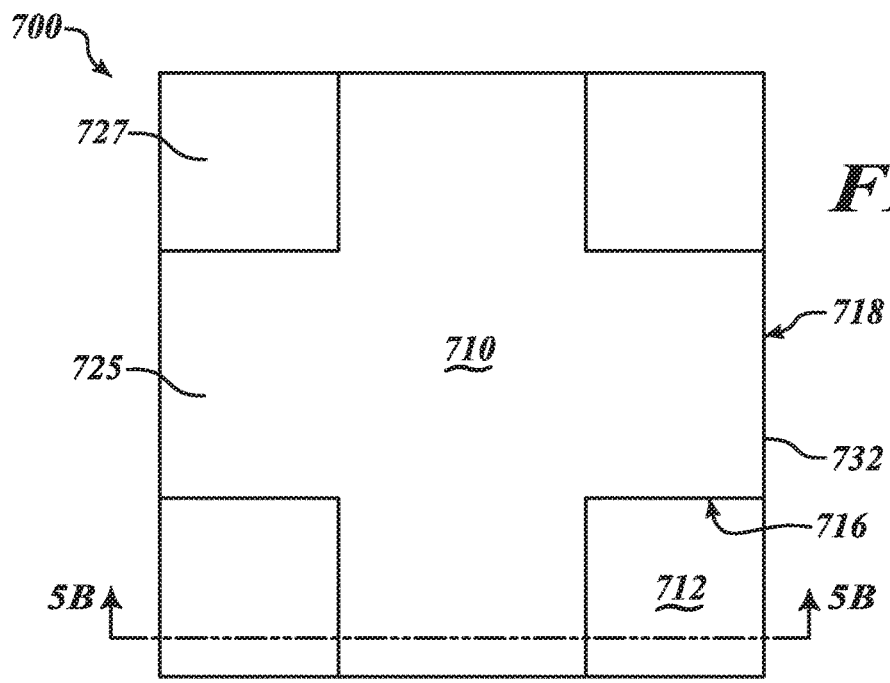
FIG. 5A is a top plan view of an alternative embodiment of a WLCSP.
Figure 5B:
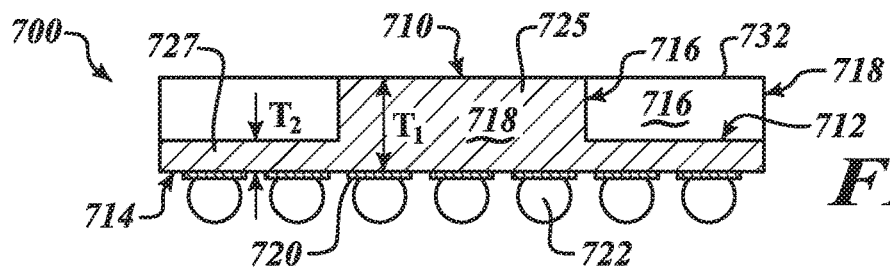
FIG. 5B is a cross-sectional view of the alternative embodiment of the WLCSP in FIG. 5A taken along line 5B-5B in FIG. 5A.

FIGS. 5A-5B are directed to another alternative embodiment of a WLCSP 700. The WLCSP 700 includes a die 732 that includes a first surface 710, a plurality of second surfaces 712, a third surface 714 opposite the first surface 710 and the plurality of second surfaces 712. The die 732 includes a plurality of fourth surfaces 716, a plurality of sidewalls 718, a plurality of UBMs 720, and a plurality of solder balls 722. An RDL is envisioned as appropriate, but not illustrated for simplicity.

In this alternative embodiment, the first surface 710, the second surfaces 712, and the fourth surfaces 716 are on an opposite side of the die as compared to the third surface 714. The first surface 710 has a plus shape that is centered at a center of the die 732 as shown in FIG. 5A. However, in other alternative embodiments, the plus shape of the first surface 710 may be off center or may be another shape. The fourth surfaces 716 are vertical or otherwise transverse to the first surface 710 and the second surfaces 712. However, in other alternative embodiments, the fourth surface 716 may be at an incline. The second surfaces 712 are located at the corners of the WLCSP 700. The first surface 710, the second surfaces 712, and the fourth surfaces 716 make up a back side surface of the WLCSP 700, which is a passive surface. The third surface 714 is a front side surface of the WLCSP 700, which is an active surface.

The plurality of sidewalls 718 includes four sidewalls 718. The four sidewalls 718 are an upside down T-shape as illustrated. However, in other alternative embodiments, the sidewalls 718 may have a rectangular shape, a trapezoid shape, or some other shape. The first sidewall is opposite the second sidewall, and the third sidewall is opposite the fourth sidewall. However, in other alternative embodiments, a WLCSP may have any number of sidewalls or may have no sidewalls.

The WLCSP 700 has a first thickness T1 that extends between the first surface 710 and the third surface 714. The WLCSP 700 has a second thickness T2 that extends between the second surfaces 712 and the fourth surface 714. The second thickness T2 is less than the first thickness T1. The surfaces 710, 712, 714 and thicknesses T1, T2 of the WLCSP 700 define a plurality of portions 725, 727 of the WLCSP 700. The plurality of portions 725, 727 includes a first portion 725 and a group of second portions 727. The first portion 725 is located between the first surface 710 and the third surface 714 and has the first thickness T1. The first portion 725 extends from the first sidewall to the second sidewall, and the first portion 725 extends from the third sidewall to the fourth sidewall. The second portions 727 are located between the second surfaces 712 and the third surface 714 and have the second thickness T2. The second portions 727 are positioned at the corners of the WLCSP 700. However, in other alternative embodiments, the second portions may have thicknesses that are all different, all the same, or any combination of thicknesses or varying thicknesses. The first portion 725 is a non-critical portion 725 and the second portions 727 are critical portions 727. These non-critical portions 725 and critical portions 727 also allow for the WLCSP 700 to be made even thinner.

Similar to the embodiment in FIGS. 1A-1E, this alternative embodiment of the WLCSP 700 includes the die 732 with a bond pad. In addition, the WLCSP 700 includes the UBMS 720, the solder balls 722, and an RDL having a first dielectric layer and a second dielectric layer. The configuration of these components is the same as discussed above with respect to FIG. 1E and as shown in FIG. 1E, even though the RDL is not illustrated in FIG. 5B for simplicity sake.

Figure 6:
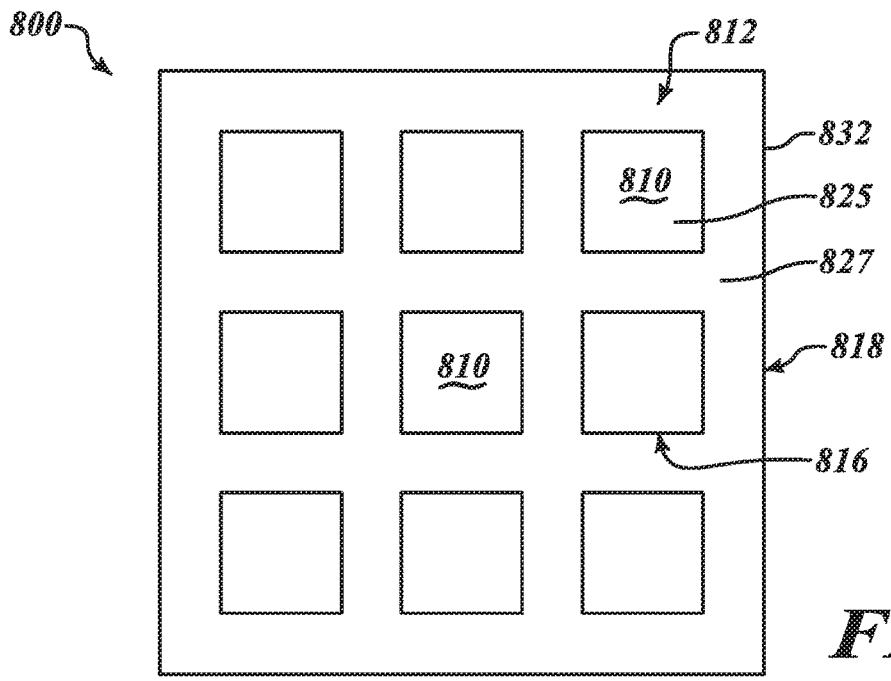
FIG. 6 is a top plan view of an alternative embodiment of a WLCSP.
Figure 7:
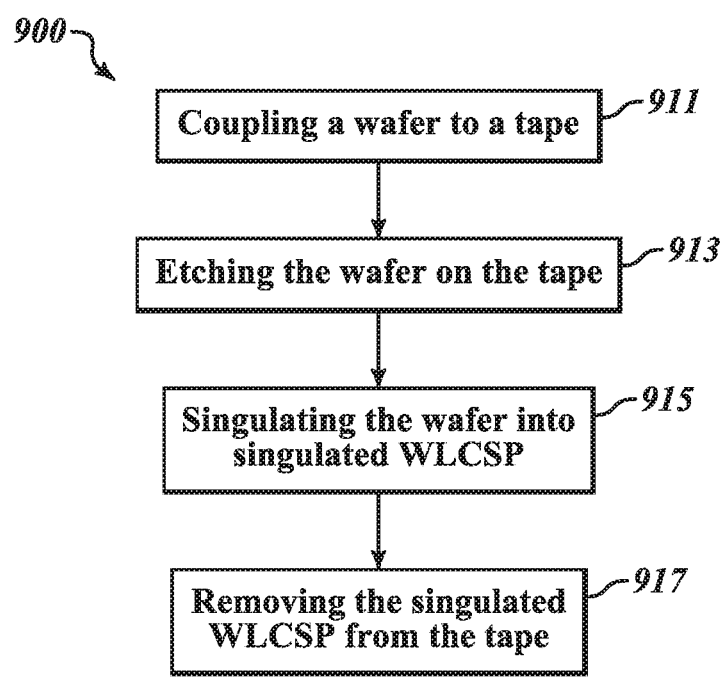
FIG. 7 is a flow chart diagram of a method of manufacturing according to the embodiments disclosed.

FIG. 6 is directed to another embodiment of a WLCSP 800. The WLCSP 800 includes a die 832 that includes a plurality of first surfaces 810, a second surface 812 that surrounds the plurality of first surfaces, a third surface opposite to the first and second surfaces 810, 812, a plurality of fourth surfaces 816 that extend between the plurality of first surfaces 810 and the second surface 812, and a plurality of sidewalls 818 that surround the other surfaces listed above.

The plurality of first surfaces 810, the second surface 812, and the plurality of fourth surfaces 816 are opposite the third surface, which cannot be seen but is similar to the third surface 114 in FIGS. 1B and 1E. The plurality of first surfaces 810, the second surface 812, and the plurality of fourth surfaces 816 make up a back side surface, which is a passive surface. The third surface makes up a front side surface, which is an active surface. The plurality of first surfaces 810 are arranged in an array of consistent shapes that are equally spaced from each other. The first surfaces 810 of the plurality of first surfaces 810 have a square shape. However, in other alternative embodiments, the plurality of first surfaces 810 may be arranged in a different format than the array shown in FIG. 6, and the first surfaces 810 of the plurality of first surfaces 810 may have a circular shape, oval shape, or a different shape. The second surface 812 surrounds each of the first surfaces 810 of the plurality of first surfaces 810. The plurality of fourth surfaces 816 are vertical surfaces or otherwise transverse to the first surfaces 810 and the second surface 812. Each fourth surface 816 extends between a respective first surface 810 of the plurality of first surfaces 810 and the second surface 812. However, in other alternative embodiments, the fourth surfaces 816 may be at an incline. The first surfaces 810, the second surface 812, the third surface, and the fourth surfaces 816 define portions of the WLCSP 800.

The WLCSP 800 includes a plurality of first portions 825 and a second portion 827. These portions represent an area of semiconductor material that remains after a process to form different thicknesses on a passive surface of a die or wafer. Each of the first portions 825 is located between a respective first surface 810 of the plurality of first surfaces 810 and the third surface. Each first portion 825 has a first thickness that extends between the respective first surface 810 and the third surface. The second portion 827 extends between the second surface 812 and the third surface and has a second thickness that extends between the second surface 812 and the third surface. The second portion 827 surrounds each first portion 825. The first thickness of the first portions 825 is greater than the second thickness of the second portion 827. The second portion 827 is aligned with trenches, gaps, or spaces that extend between the first portions 825. The first portions 825 are non-critical portions 825 and the second portion 827 is a critical portion 827. These non-critical portions 825 and this critical portion 827 also allow for the WLCSP 800 to be made even thinner.

Similar to the embodiment in FIGS. 1A-1E, this alternative embodiment of the WLCSP 800 includes the die 832 with bond pads. In addition, the WLCSP 800 includes UBMS, solder balls, and an RDL on the third surface. The RDL includes a first dielectric layer and a second dielectric layer. The configuration of these components is the same as discussed above with respect to FIG. 1E and as shown in FIG. 1E, even though the RDL is not illustrated in FIG. 6 for simplicity sake.

FIGS. 7 and 8A-8E are directed to a method of forming the WLCSPs discussed above. A first step 911 includes coupling a wafer to a tape. The wafer includes a plurality of die having active and passive electronic components arranged in a way to execute a desired process, such as sensing, processing, data storage, data transmission, or any other suitable use for a die or chip. A second step 913 includes etching the wafer. The etching may be an isotropic etch, a anisotropic etch, or a combination of both. The etching may be a wet etch or a dry etch. This etching process results in the varying thicknesses of the various embodiments of a WLCSP with varying thicknesses as discussed in the present disclosure. A third step 915 includes singulating the etched wafer into WLCSPs. The etched wafer is singulated into WLCSPs utilizing a cutting device 943. The cutting device 943 may be a laser, a saw, or some other device capable cutting a wafer into WLCSPs. A fourth step 917 includes removing the WLCSP from the tape 940. The removing the WLCSP from the tape may be accomplished by a pick and place process. However, while this flow chart includes several steps, in other alternative embodiments, there may be more steps or fewer steps in manufacturing the embodiments of the WLCSP discussed above and other alternative embodiments of a WLCSP.

Figure 8A:
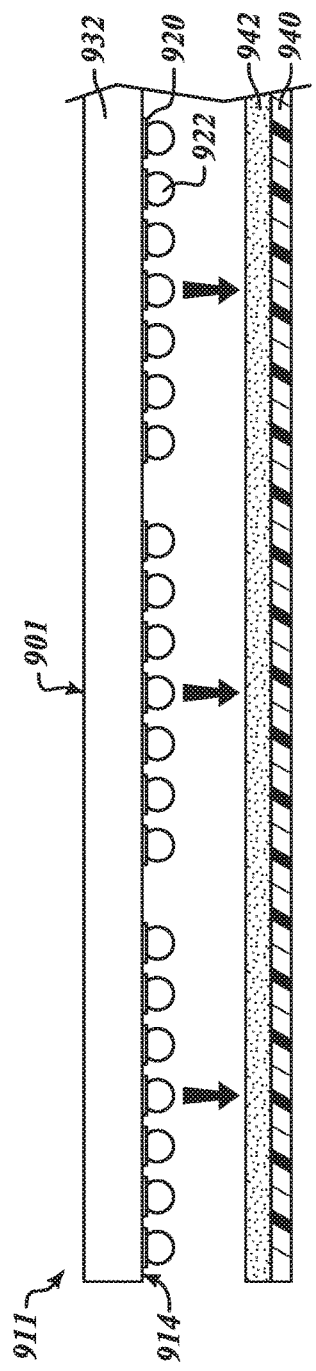
Figure 8B:
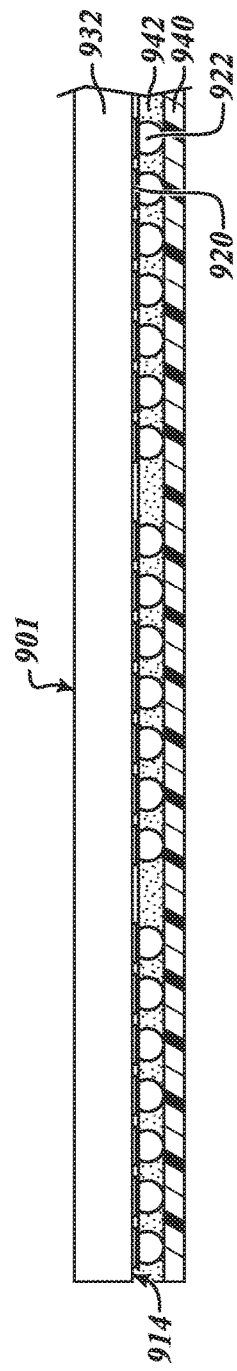

FIGS. 8A-8B are directed to the first step 911 of coupling a wafer 932 to a tape 940 or other support for the packaging process. The wafer 932 includes a passive back side surface 901 opposite an active front side surface 914. Lateral side surfaces 918 separate the passive back side surface 901 from the active front side surface 914. A plurality of UBMs 920 is on the active front side surface 914 of the wafer 932 and a plurality of solder balls 922 are coupled to the UBMs 920. In this representation, the wafer is processed to include an RDL (not shown) coupled to the UBMs and solder balls before the singulation. In other embodiments, the RDL and other features may be formed after singulation. The RDL may include a first dielectric layer, a second dielectric layer, and a conductive layer. However, in other alternative embodiments, the RDL may include any number of conductive or non-conductive layers.

The wafer is coupled to an adhesive 942 of the tape 940. The tape 940 may be a kapton tape, a copper tape, or some other carrier suitable to hold the wafer during this process. The adhesive may be a glue, a die attach film, or some other adhesive material. The wafer 932 is coupled to the adhesive 942 of the tape 940 by placing the plurality of solder balls 922 in the adhesive 942 of the tape 940 as shown in FIG. 8B. However, in an alternative embodiment of this method, the wafer 932 may be coupled to the adhesive 942, the solder balls 922 may be on the adhesive layer 942, or some other coupling technique may be utilized to attach the wafer 932 to the tape 940.

Figure 8C:
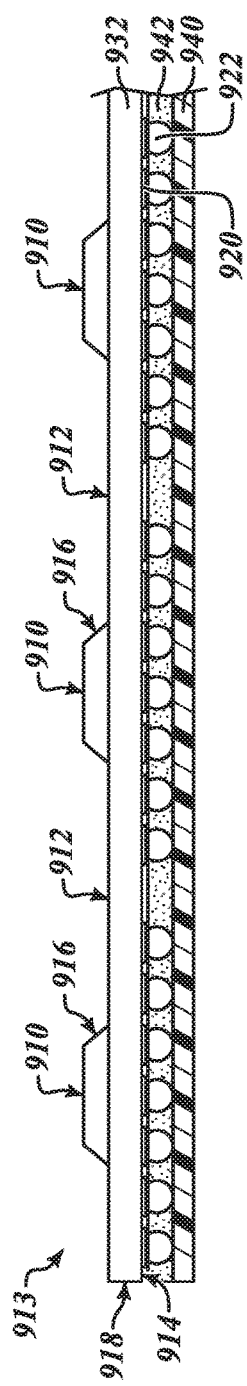

FIG. 8C is directed to second step 913 of etching the wafer 932 where portions of the silicon or other semiconductive material of the wafer are removed forming various shapes and thicknesses on the passive side of the wafer. After the first etching step 913 the wafer 932 includes first surfaces 910, a second surface 912, and third surfaces 916 between the first surfaces 910 and the second surface 912. In this embodiment, the third surfaces 916 are inclined surfaces 916. However, in other alternative embodiments, the third surfaces 916 may be vertical surfaces. The first surfaces 910, the second surface 912, and the third surfaces 916 make up the back side surface, which is a passive surface. As described above, the etching can form a variety of shapes and patterns to accommodate the underlying circuitry in the die (the critical and non-critical portions).

The back side surface 901, which is the passive surface, having surfaces 910, 912, 916 is opposite the front side surface 914, which is an active surface. This first etching step 913 may include applying a mask material to the back side 901 of the wafer. The mask may be a photoresist mask, a hard mask, or some other type of mask material utilized for etching the wafer 932 using some etching technique. The etching technique may be an anisotropic etching, an isotropic etching, a chemical etch, a radiation etch, a plasma etch, a water jet etch, or some other type of etching technique. The mask defines portions of the wafer 932 to stay and to be removed during this etching step 913. After the wafer 932 has been etched, the mask is then removed.

FIG. 8D is directed to the third step 915 of singulating the etched wafer 932 into distinct WLCSPs. The wafer 932 may be singulated into individual WLCSPs by a cutting device 943. The cutting device 943 may be a saw, a laser, a water jet, or some other cutting device. On the other hand, the wafer 932 may be singulated into individual WLCSPs by a second etching step. If a second etching step is used, a second mask may be applied to the wafer 932 and then the wafer 932 is etched again. This second etching step, which is to singulate the wafer 932 into individual WLCSPs, may be an anisotropic etching, an isotropic etching, a chemical etching, a water jet etching, a plasma etch, a radiation etch, or some other type of etching technique. After this second etching step is complete, the second mask would be removed.

FIG. 8E is directed to the fourth step 917 of removing the WLCSPs from the tape 940. In this removal step 917, the individual WLCSPs are removed from the adhesive 942 of the tape 940. At this point, the WLCSPs are ready to be further processed or shipped.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a die of semiconductor material including:
a central region and a peripheral region around the central region;
a first surface of the semiconductor material at the central region having a first surface area;
a second surface of the semiconductor material and of the peripheral region having a second surface area greater than the first surface area and surrounding the first surface;
a plurality of inclined surfaces of the semiconductor material extending from the first surface to the second surface;
a third surface of the semiconductor material opposite to the first surface, the second surface, and the plurality of inclined surfaces;
a first portion having a rectangular shape, the first portion being at the central region, and the first portion having a first thickness that extends from the third surface to the first surface, the first portion including a plurality of edges from which the plurality of inclined surfaces extend;
a second portion extending from the first portion, the second portion having a varying thickness that extends from the plurality of inclined surfaces to the third surface; and
a third portion extending from the second portion, the third portion being spaced from the first portion by the second portion, the third portion having a second thickness that extends from the second surface to the third surface, the second thickness is less than the first thickness, the third portion surrounds the first portion and the second portion and is at the peripheral region, the third portion includes a plurality of first sidewalls, and each first sidewall of the plurality of first sidewalls of the third portion is at an angle to each edge of the plurality of edges of the first portion.

2. The device of claim 1, wherein the plurality of inclined surfaces that extend from the first surface to the second surface are transverse to the first surface and the second surface.

3. The device of claim 1, wherein a center of the first surface is positioned at a center of the die.

4. The device of claim 1, wherein the die further includes sidewalls of the semiconductor material having the second thickness and extending from the third surface to the second surface.

5. The device of claim 1, wherein the first portion and the second portion extend away from the third portion.

6. The device of claim 1, wherein the third surface of the die includes a plurality of contact pads and a plurality of solder balls coupled to the plurality of contact pads.

7. A device, comprising:
a die of semiconductor material including:
a surface of the semiconductor material;
a first sidewall of the semiconductor material, the first sidewall is transverse to the surface;
a second sidewall of the semiconductor material opposite to the first sidewall, the second sidewall is transverse to the surface;
a first portion having a first thickness, the first portion being centrally positioned along the die, the first portion has a central surface having a first surface area, the central surface is opposite to the surface; and
a second portion having a second thickness that is less than the first thickness, the second portion extends from the first portion to the first sidewall, the second portion includes a first inclined surface of the semiconductor material that extends from the first portion to the first sidewall, the first inclined surface being transverse to the first sidewall, being transverse to the central surface of the first portion, and having a second surface area that is larger than the first surface area;
a third portion having a third thickness that is less than the first thickness, the third portion extends from the first portion to the second sidewall, the third portion is separated from the second portion by the first portion, the third portion includes a second inclined surface of the semiconductor material that extends from the first portion to the second sidewall, the second inclined surface being transverse to the second sidewall; and
a third sidewall of the semiconductor material, the third sidewall extends from the first sidewall to the second sidewall, extends from the first inclined surface, the second inclined surface, and the central surface to the surface, and is transverse to the first sidewall, the second sidewall, the first inclined surface, the second inclined surface, and the central surface.

8. The device of claim 7, wherein the die further includes a fourth sidewall of the semiconductor material, the fourth sidewall is opposite to the third sidewall, extends from the first sidewall to the second sidewall, extends from the first inclined surface, the second inclined surface, and the central surface to the surface, and is transverse to the first sidewall, the second sidewall, the first inclined surface, the second inclined surface, and the central surface.

9. The device of claim 8, wherein the third sidewall and the fourth sidewall have a shape of a trapezoid stacked on a rectangle.

10. The device of claim 7, wherein the first and second inclined surfaces are spaced apart from each other by the first portion.

11. The device of claim 7, further comprising circuitry within the semiconductor material of the die.

12. A device, comprising:
a die of semiconductor material including:
a first side of the semiconductor material and a second side of the semiconductor material opposite to the first side;
a first edge of the semiconductor material;
a second edge of the semiconductor material;
a central region of the semiconductor material between the first edge and the second edge, the central region including a central surface of the semiconductor material, the central region spaced inward from the first edge and the second edge;

a first trapezoidal inclined surface of the semiconductor material extending from the central surface to a first edge, the first trapezoidal inclined surface at the first side;

a second trapezoidal inclined surface of the semiconductor material extending from the central region to the second edge, the second trapezoidal inclined surface at the first side; and circuitry within the semiconductor material and between the first side and the second side.

13. The device of claim 12, wherein:
the first edge is transverse to the second edge;
the first and second edge intersect at a corner of the die; and
the first trapezoidal inclined surface abuts the second trapezoidal inclined surface.

14. The device of claim 12, wherein:
the first edge is opposite to the second edge;
the first trapezoidal inclined surface is on a first side of the central region; and
the second trapezoidal inclined surface is on a second side of the central region opposite to the first side.

15. The device of claim 12, wherein:
the first edge is opposite to the second edge;
the die further includes:
 a third edge of the semiconductor material extending from the first edge to the second edge, the third edge is transverse to the first edge and the second edge;
 a fourth edge of the semiconductor material extending from the first edge to the second edge, the fourth edge is opposite to the third edge, the fourth edge is transverse to the first edge and the second edge;
 a third trapezoidal inclined surface of the semiconductor material extending from the central region to the third edge; and
 a fourth trapezoidal inclined surface of the semiconductor material extending from the central region to the fourth edge.

16. The device of claim 15, wherein:
the first trapezoidal inclined surface abuts the third trapezoidal inclined surface and the fourth trapezoidal inclined surface; and
the second trapezoidal inclined surface abuts the third trapezoidal inclined surface and the fourth trapezoidal inclined surface.

17. The device of claim 15, wherein the first, second, third, and fourth trapezoidal inclined surfaces are the same size and shape.

18. The device of claim 12, wherein the die further includes:
a surface opposite to the central surface, the first trapezoidal inclined surface, and the second trapezoidal inclined surface;
a first sidewall extends from the first edge to the surface opposite to the central surface, the first trapezoidal inclined surface, and the second trapezoidal inclined surface; and
a second sidewall extends from the second edge to the surface opposite to the central surface, the first trapezoidal inclined surface, and the second trapezoidal inclined surface.

19. The device of claim 12, wherein the first and second trapezoidal inclined surfaces are the same size and shape.

20. The device of claim 1, wherein circuitry is within the semiconductor material of the die.

* * * * *